May 3, 1960 J. M. PARSONS 2,934,964

FINE TUNING MECHANISM

Filed April 25, 1958

INVENTOR:
JOHN M. PARSONS,
BY Joseph Levinson
HIS ATTORNEY.

United States Patent Office 2,934,964

Patented May 3, 1960

2,934,964

FINE TUNING MECHANISM

John M. Parsons, Syracuse, N.Y., assignor to General Electric Company, a corporation of New York Application April 25, 1958, Serial No. 730,895

6 Claims. (Cl. 74—10.15)

Figures 1, 2, 3:
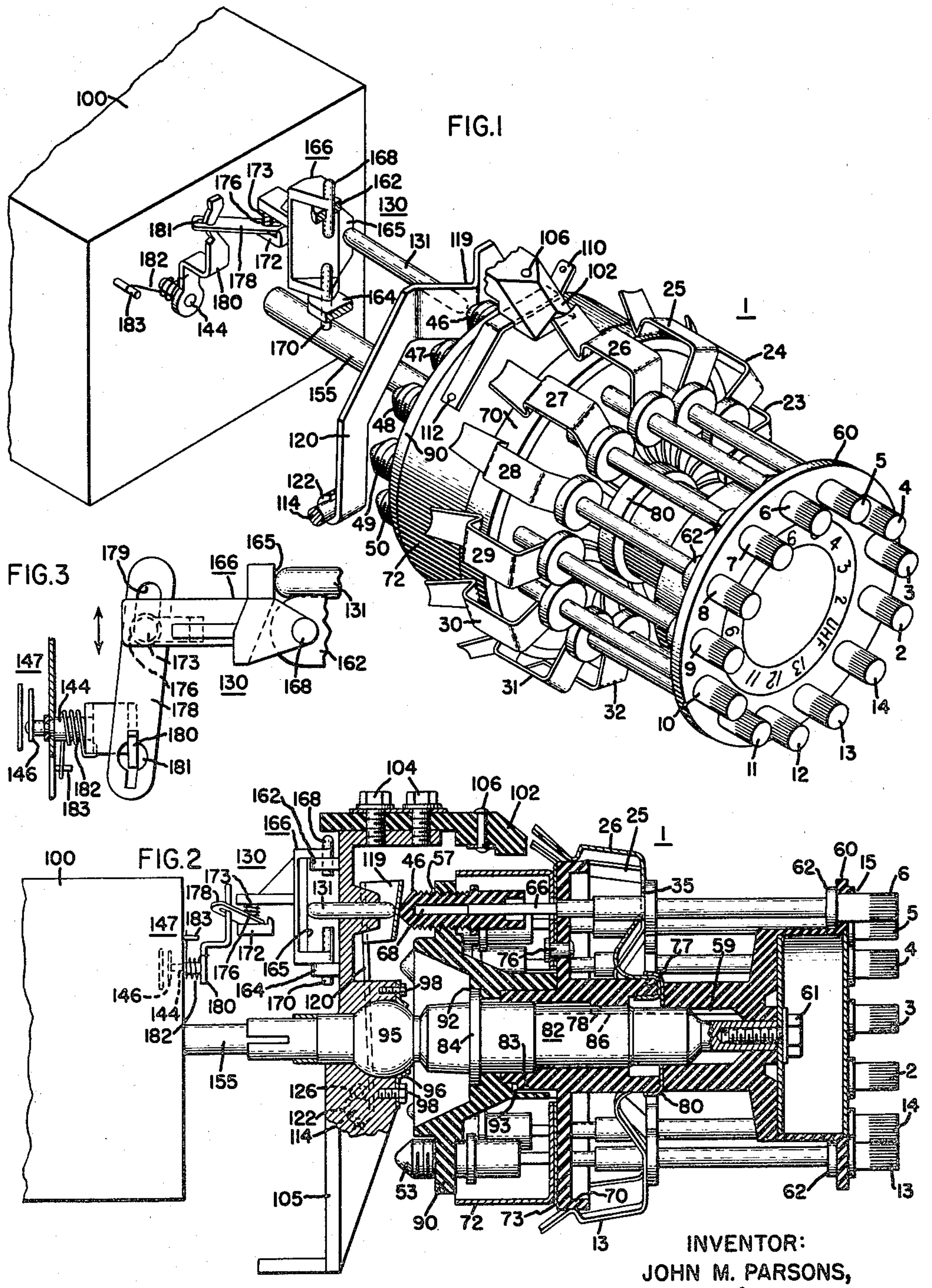

This invention relates to a fine tuning mechanism adapted to be utilized in an automatic fine tuning system for a television receiver.

In a co-pending application entitled "Automatic Tuning System," Serial No. 730,896, filed April 25, 1958, now Patent No. 2,901,615, which is assigned to the assignee of this invention, an automatic tuning system is disclosed which provides for automatic channel selection and automatic fine tuning in a television receiver. In the aforesaid system, a motor driven channel selector knob is provided with a plurality of push buttons each of which represent a predetermined television channel. To select any given channel, the push button corresponding to that channel is depressed causing the channel selector knob to be automatically rotated to the channel desired. The requisite switching to obtain the proper channel is provided in a conventional television tuner which is well known to those skilled in the art. The system also provides fine tuning for each channel. This is accomplished by a variable impedance element connected in the tuner circuit which is adapted to vary the frequency in the tuner over a predetermined range. Each push button is provided with a fine tuning screw, the setting of which is transmitted by a fine tuning linkage means to the variable impedance element for the adjustment thereof. This invention resides in the aforesaid fine tuning linkage means.

Accordingly, it is an object of this invention to provide an improved automatic fine tuning means for an automatic tuning system for a television receiver.

A further object of this invention is to provide an improved fine tuning linkage means for coupling the setting of one adjustable element to a variable impedance element which is to be varied in accordance with the setting of the adjustable element.

In carrying out this invention, a channel selector knob is provided having a plurality of push buttons thereon representing a plurality of television channels. An adjustable fine tuning screw is provided for each channel which is adapted to be adjusted by a corresponding pushbutton. The setting of the fine tuning screw is transmitted by a fine tuning linkage means to a variable impedance element in the television tuner for the adjustment thereof in accordance with the setting of the fine tuning screw. The fine tuning linkage means is comprised of a swivel plate which is adapted to rockably transmit the setting of a fine tuning screw thereby providing a rotary motion to the movable element of the variable impedance element to adjust the impedance thereof. Once the fine tuning adjustment is initially made, it is set so that subsequent selection of the same channel automatically provides fine tuning for that channel.

These and other advantages of this invention will be more clearly understood from the following description taken in connection with the accompanying drawings, and its scope will be apparent from the appended claims.

In the drawings,

Fig. 1 is a perspective of the automatic fine tuning system employing the fine tuning linkage means embodied in this invention, Fig. 2 is a side elevation, partly in section, of the automatic tuning system shown in Fig. 1, and Fig. 3 is a top view of the fine tuning linkage means shown in Figs. 1 and 2.

Since the fine tuning linkage means embodied in this invention is adapted to be utilized in an automatic tuning system such as disclosed in the aforesaid application, it is here described in connection with such a system.

As shown in Fig. 1, the automatic fine tuning system generally comprises a channel selector means 1, a fine tuning linkage means 130 and a tuner 100 having a tuner shaft 155 therein. The tuner 100 is of conventional form well known to those skilled in the art. It is assumed that the necessary circuitry and means for properly switching such circuitry is provided in the tuner such that when the channel selector means is set to select a particular television channel that the tuner has the circuitry capable of providing the desired frequency range of the channel selected. It should also be pointed out that with respect to the fine tuning function performed in this system, all that is necessary for purposes of this disclosure is that the tuner have a variable impedance element which is capable of altering the frequency of the tuner to provide for fine tuning. Such means are also generally provided in conventional tuners presently utilized in the art.

The channel selector means 1 is provided with a channel selector knob 60 having a plurality of push buttons 2–14 positioned through a plurality of openings 15 therein. Each push button is provided with an annular flange 62 thereon for positioning the push buttons in the openings 15. The channel selector knob 60 is mounted on a control shaft 82 by means of a key 59 thereon which registers with a keyway 86 in the control shaft 82. The channel selector knob 60 is secured to the control shaft 82 by means of a screw 61. This type of mounting allows the channel selector knob 60 to rotate with the control shaft 82.

A bearing disc 70 of suitable insulating material is mounted on the control shaft 82 by means of a key 78 thereon which registers with the keyway 86 in the control shaft 82. A plurality of spring contacts 22–34 each having an opening 35 therein are mounted upon an annular flange 77 of the bearing disc 70. The spring contacts are conductively connected to the shaft 82 by a grounding disc 80. A collector ring 72 is mounted on the bearing disc 70 by means of rivets 76 (one shown). A filler disc 73 is positioned between a collector ring 72 and the bearing disc 70. The collector ring 72 and the filler disc 73 each have a plurality of openings corresponding to the number of push buttons to allow the push buttons to extend therethrough.

The control shaft 82 is rotatably mounted in a mounting plate 105 by the bearing 95 which is mounted in the mounting plate 105 by a shaft bearing plate 96 secured to the plate 105 by a pair of screws 98 (one shown). A contact shoe 102 is secured to the mounting plate 105 by a pair of screws 104. A terminal member 110 is secured to the contact shoe 102 by a rivet 106. The terminal member 110 has a contact member 112 which makes contact with the collector ring 72. The entire channel selector means 1 is adapted to be rotated. The tuner shaft 155 and the control shaft 82 are intercoupled preferably in a manner shown and described in an application to John M. Parsons, Serial No. 721,821 which is assigned to the assignee of the present application. The channel selector means 1 may be rotated thereby rotating the tuner shaft 155, or it may be driven by the tuner shaft 155 in a manner shown and described in the aforesaid application, "Automatic Tuning System." Much of this structure which has just been described relates to the automatic channel selection function performed by the system in the aforesaid application. Accordingly, the operation of this structure is not described in this application. Much of this structure could be discarded if only a manual channel selection system is utilized. This invention has utility in either a manual or an automatic channel selection system.

The fine tuning structure to which this application relates includes a plurality of fine tuning screws 42–54 which are mounted in a plurality of threaded holes 57 in a fine tuning disc 90. The fine tuning screws 42–54 are adapted to be adjusted by the rotation of the push buttons 2–14, respectively. Each fine tuning screw is provided with a channel 68 therein adapted to receive a respective push button tongue portion 66. The tongue portion 66 of each push button is adapted to be slidably mounted within the channel 68 of a corresponding fine tuning screw such that the fine tuning screw is rotated by the rotation of its corresponding push button. The fine tuning mounting disc 90 is provided with a keyway 93 which registers with a key 83 on the bearing disc 70. Consequently, the fine tuning disc 90 is mounted on the bearing disc 70 with the keyway 93 of the fine tuning disc 90 registering with the key 83 on the bearing disc 70. The fine tuning disc 90 also has an annular shelf 92 thereon which registers with an annular flange 84 on the control shaft 82 to provide further positioning and mounting of the fine tuning disc 90 on the control shaft 82.

The fine tuning linkage means embodied in this invention is referred to generally with the reference character 130. The fine tuning linkage means 130 functions to transmit the setting of any given fine tuning screw to the variable impedance element 147 in the tuner 100, the impedance of which is determined by setting of the fine tuning screw. The fine tuning linkage means 130 includes a fine tuning guide 120 having a generally horseshoe shape with a generally V-shaped intermediate or base portion 119 and a pair of legs which terminate in eyelets 122, one of which is shown on Figs. 1 and 3. The intermediate portion 119 is V-shaped to accommodate rotation of the control shaft 82 in either direction thereby allowing manual operation of the channel selector knob 60. The mounting plate 105 is provided with a pair of pins 114 (one shown) which are adapted to receive the eyelets 122 of the fine tuning guide 120. A cotter pin 126 which is mounted on the pin 114 holds the fine tuning guide 120 in a floating position on the mounting plate 105. As will be seen in Figs. 1 and 2, the fine tuning screw 46 bears on the V-shaped portion 119 of the fine tuning guide 120. A guide pin 131 which is positioned in an opening in the mounting plate 105 is adapted to bear on the other side or inner portion of the V-shaped intermediate portion 119 of the guide 120. The fine tuning guide 120 and the guide pin 131 may be considered to be floating elements which are movable by the settings of the fine tuning screws. The other end of the guide pin 131 bears on a bearing surface 165 of a swivel plate 166. The swivel plate 166 is provided with a pair of pins 168 and 170 which are adapted to be received in a pair of openings in a pair of flanges 162 and 164, respectively, which are a unitary part of the mounting plate 105. The swivel plate 166 is provided with a leg portion 173 having a shoe 172 thereon. A spring 176 is mounted on the leg 173. A link 178 having a hole 179 in one end portion thereof is adapted to be mounted on the leg 173 by slipping the opening 179 over the shoe 172. The shoe 172 and the spring 176 retain the link on the leg 173. The link 178 is coupled to a capacitor arm 180 which is received in a notched hole 181 in the other end portion of the link 178. The capacitor arm 180 is adapted to drive a shaft 144 to which it is coupled. The shaft 144 has mounted thereon the movable plate

146 of the variable impedance element 147 which is positioned in the tuner. The capacitor arm 180 is spring loaded by a spring 182 which is mounted on the shaft 144 and is connected to the capacitor arm 180 and to a post 183 mounted on the tuner 100.

In order to provide fine tuning in the fine tuning system disclosed, the push button of the channel selected is rotated which in turn rotates the corresponding fine tuning screw. For example, in Figs. 1 and 3, channel 6 has been selected and is in position for a fine tuning adjustment. The adjustment is made by rotating push button 6 which rotates fine tuning screw 46. Fine tuning screw 46 bears on the V-shaped intermediate portion 119 of tuning guide 120 which in turn bears on pin 131. The pressure exerted by the fine tuning screw 146 is transmitted by pin 131 to the bearing surface 165 of the swivel plate 166. The swivel plate 166 rocks a predetermined amount in accordance with the pressure exerted thereon by the fine tuning pin 131. The rockable motion about the axis of the swivel plate 166 moves the link 178 a predetermined amount. Movement of the link 178 is transmitted into rotary motion by the capacitor arm 180 which is coupled to the shaft 144. The capacitor arm 180 and the shaft 144 are rotated in accordance with the pressure exerted by the pin 131 on the bearing surface 165 of the swivel plate 166. Rotation of the shaft 144 causes rotation of the movable element 146 of the variable impedance element 147 to vary the impedance thereof.

Briefly stated, a fine tuning adjustment may be made for any given channel by merely rotating the push button of that channel to rotate the fine tuning screw associated therewith. The setting of the fine tuning screw for the particular channel desired is transmitted by the fine tuning linkage means 130 to a variable impedance element 147 in the tuner 100. The setting of the fine tuning screw is translated into radial movement by the swivel plate 166 and its associated link 178. This radial movement is translated from the link 178 to the capacitor arm 180 to rotate the movable plate of the variable impedance element 147 to thereby vary the impedance thereof and thereby provide fine tuning in the tuner 100.

Once the aforesaid vernier or fine tuning adjustment has been made for any given channel, further adjustment in switching back to that channel will not ordinarily be necessary. Consequently, automatic fine tuning is provided in that once an initial setting has been made, no further fine tuning adjustment is ordinarily required.

The type of linkage utilized in the aforesaid fine tuning system has several distinct advantages. The swivel plate 166 is molded and requires no special camming. The link 178 is positively retained on leg 173 of the swivel plate 166 by the shoe 172 and the spring 176. Consequently, the link accurately transmits the rocker or rotational motion of the swivel plate directly to the capacitor arm 180 thereby providing a positive and accurate means for varying the variable impedance element to provide accurate fine tuning. It will also be noted that the hole 181 in link 178 is slotted such that the capacitor arm 180 can be assembled in only one position so that the link 178 will not slip off. Another advantage of the fine tuning linkage means 130 is in its adaptability to be used with conventional tuners.

Since other modifications varied to fit particular operating requirements and environments will be apparent to those skilled in the art, the invention is not considered limited to the examples chosen for purposes of disclosure and covers all changes and modifications which do not constitute departures from the true spirit and scope of this invention.

What I claim as new and desire to secure by Letters Patent of the United States is:

1. A tuning system for providing fine tuning for a tuner of a television receiver, comprising in combination, a control shaft, a channel selector knob mounted on said control shaft for rotation therewith, a plurality of push buttons on said control knob each representing a different television channel, a tuner, a variable impedance having a movable element mounted in said tuner for providing fine tuning therefor, a fine tuning screw coupled to each of said push buttons for adjustment thereby, a fine tuning guide adapted to be selectively engaged by any one of said fine tuning screws by the rotation of said channel selector knob, a swivel plate having a bearing surface and a leg portion thereon, a guide pin in contact with said fine tuning guide and the bearing surface of said swivel plate for transmitting the movement of said fine tuning guide corresponding to a particular setting of one of said fine tuning screws to said swivel plate, a link coupled between the leg portion of said swivel plate and the movable element of said variable impedance for transmitting the movement of said swivel plate to the movable element of said variable impedance element for adjusting the impedance thereof.

2. A fine tuning linkage means for transmitting the setting of a fine tuning means to a variable impedance element in a television tuner for providing fine tuning therefor comprising, a swivel plate having a bearing surface and a leg portion thereon, said bearing surface adapted to be coupled to a fine tuning means, said leg portion having a shoe thereon, a link having an opening on one end portion thereof which is adapted to fit on said shoe, a spring mounted on said leg portion for spring loading said link, a variable impedance means having a rotatable element, an arm coupled to said rotatable element, a second opening having a notch therein on the other end portion of said link, said arm adapted to be positioned in the opening of said link and retained therein by said notch.

3. A fine tuning system for providing fine tuning for a tuner of a television receiver, comprising in combination, a control shaft, a channel selector knob mounted on said control shaft for rotation therewith, a plurality of push buttons on said control knob each representing a different television channel, a tuner, a variable impedance element mounted in said tuner for providing fine tuning therefor, fine tuning linkage means having a swivel plate with a link thereon coupled to said variable impedance element for adjusting the impedance thereof in accordance with the movement of said swivel plate, fine tuning means coupled to each of said push buttons for adjustment thereby, means for selectively coupling any one of said fine tuning means to said swivel plate thereby moving said swivel plate in accordance with the setting of the fine tuning means coupled thereto.

4. A fine tuning device for providing fine tuning for a tuner of a television receiver, comprising in combination, a control shaft, an adjustable element representing each television channel mounted on said control shaft, means for individually adjusting said adjustable elements, a tuner, a variable impedance element mounted in said tuner for providing fine tuning therefor, fine tuning linkage means having a swivel plate with a link thereon coupled to said variable impedance element for adjusting the impedance thereof in accordance with the movement of said swivel plate, means for coupling any one of said adjustable elements to said swivel plate whereby said swivel plate is moved in accordance with the setting of said adjustable element thereby moving said link and said variable impedance element to change the impedance thereof in accordance with the setting of said adjustable element.

5. A tuning system for providing fine tuning for a tuner of a teleivsion receiver, comprising in combination, a control shaft, a fine tuning screw for each television channel mounted on said control shaft for rotation therewith, means for individually adjusting any one of said fine tuning screws in accordance with the amount of fine tuning desired, a tuner, a variable impedance element having a movable element mounted in said tuner for providing fine tuning therefor, a fine tuning guide adapted to be selectively engaged by any one of said fine tuning screws by the rotation of said control shaft, a swivel plate having a bearing surface and a leg portion thereon, a guide pin in contact with said fine tuning guide and the bearing surface of said swivel plate for transmitting the movement of said fine tuning guide corresponding to particular setting of one of said fine tuning screws to said swivel plate a link coupled between the leg portion of said swivel plate and the movable element of said variable impedance for transmitting the movement of said swivel plate to the movable element of said variable element for adjusting the impedance thereof.

6. In a mechanism for adjusting a television tuner wherein means are provided for moving a guide pin back and forth in an axial direction, the combination of an electrical tuning element in circuit relationship with said tuner, said tuning element being varied by rotation of a shaft which extends in a direction parallel to said guide pin, a swivel plate mounted for rotation about an axis that is perpendicular to said guide pin and offset therefrom, said swivel plate having bearing surface on one side of its axis that is in contact with an end of said guide pin, a link, means for mounting one end of said link on said swivel plate so that it is free to move about an axis that is parallel to said axis of said swivel plate and displaced therefrom, an arm extending radially from said shaft that varies said tuning element, and means for pivotally mounting the other end of said link to said arm, whereby axial motion of said guide pin causes said swivel plate to rotate so as to move said link and hence to rotate said arm and said shaft.

References Cited in the file of this patent

UNITED STATES PATENTS

| | | |
|---|---|---|
| 2,484,331 | Bels | Oct. 11, 1949 |
| 2,521,968 | De Tar et al. | Sept. 12, 1950 |
| 2,533,810 | Jacob et al. | Dec. 12, 1950 |
| 2,534,768 | Hall | Dec. 19, 1950 |
| 2,588,093 | Dull | Mar. 4, 1952 |
| 2,808,506 | Skwarek | Oct. 1, 1957 |
| 2,839,936 | Dawson | June 24, 1958 |
| 2,877,351 | Sacre | Mar. 10, 1959 |